United States Patent
Kamikuri et al.

(10) Patent No.: US 6,563,206 B2
(45) Date of Patent: May 13, 2003

(54) SEMICONDUCTOR DEVICE AND SEMICONDUCTOR DEVICE STRUCTURE

(75) Inventors: Koichi Kamikuri, Kanagawa (JP); Hitoshi Shibue, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/044,132

(22) Filed: Jan. 10, 2002

(65) Prior Publication Data

US 2002/0096784 A1 Jul. 25, 2002

(30) Foreign Application Priority Data

Jan. 15, 2001 (JP) ...................... P2001-006384

(51) Int. Cl.[7] .............................. H01L 23/02
(52) U.S. Cl. .................. 257/686; 257/778; 257/777
(58) Field of Search .................. 257/685, 686, 257/777, 778, 784

(56) References Cited

U.S. PATENT DOCUMENTS

| | | | |
|---|---|---|---|
| 5,394,303 A | * | 2/1995 | Yamaji |
| 5,903,049 A | * | 5/1999 | Mori |
| 6,057,598 A | * | 5/2000 | Payne et al. |
| 6,075,712 A | * | 6/2000 | McMahon |
| 6,208,521 B1 | * | 3/2001 | Nakatsuka |
| 6,239,496 B1 | * | 5/2001 | Asada |
| 6,258,626 B1 | * | 7/2001 | Wang et al. |
| 6,300,679 B1 | * | 10/2001 | Mukerji et al. |
| 6,407,448 B2 | * | 6/2002 | Chun |
| 6,407,456 B1 | * | 6/2002 | Ball |
| 6,462,420 B2 | * | 10/2002 | Hikita et al. |

FOREIGN PATENT DOCUMENTS

| | | | |
|---|---|---|---|
| JP | 59-229850 | * | 12/1984 |
| JP | 3-231450 | * | 10/1991 |
| JP | 5-13663 | * | 1/1993 |

* cited by examiner

Primary Examiner—Sheila V. Clark
(74) Attorney, Agent, or Firm—Sonnenschein, Nath & Rosenthal

(57) ABSTRACT

The present invention provides a semiconductor device bonded to a wiring board in a flip-chip bonding manner, wherein bumps for the flip-chip bonding are formed on a front surface of the semiconductor element, and a wiring pattern to which bumps and bonding wires for another semiconductor element are connected is formed on a back surface of the semiconductor element. The present invention also provides a semiconductor device structure including a first semiconductor element and a second semiconductor element sequentially stacked in multi-stages on a wiring board by flip-chip bonding, wherein a wiring pattern of the first semiconductor element is bonded to segments of wiring formed on the wiring board by means of bonding wires. With this configuration, it is possible to realize a thin semiconductor device of a stacked structure including a plurality of semiconductor elements mounted at a higher density and hence to miniaturize an electronic device using the semiconductor device.

4 Claims, 2 Drawing Sheets

SEMICONDUCTOR DEVICE AND SEMICONDUCTOR DEVICE STRUCTURE

RELATED APPLICATION DATA

The present application claims priority to Japanese Application(s) No(s). P2001-006384 filed Jan. 15, 2001, which application(s) is/are incorporated herein by reference to the extent permitted by law.

BACKGROUND OF THE INVENTION

The present invention relates to a semiconductor device including a plurality of semiconductor elements stacked to each other and a structure of the semiconductor device, and particularly to a technique of thinning a semiconductor device by stacking a plurality of semiconductor elements to each other at a higher density.

If one semiconductor element is mounted on a wiring board, then an area of the wiring board is occupied with the semiconductor device, and thereby another semiconductor element is no longer mounted on the wiring board. On the other hand, in recent years, electronic devices such as video cameras, CDs, and portable telephones have been required to be further reduced in size and further enhanced in performance. To meet such a requirement, there has been proposed a semiconductor device, in which a semiconductor element mounting area becomes twice that of a prior art semiconductor device although the semiconductor device uses the same wiring board as that used for the related art semiconductor device.

The above-described related art semiconductor device, which is designated by reference numeral 1 in FIG. 4, includes two semiconductor elements 3 and 5, wherein a surface (back surface) 9 opposed to an electric connection surface 7 of the semiconductor element 3 is superimposed to a surface (back surface) 13 opposed to an electric connection surface 11 of the other semiconductor element 5 and is bonded thereto with adhesive 15, and the electric connection surface 11 of the upper semiconductor element 5 is electrically connected to segments 21 of wiring on a wiring board 19 by means of bonding wires 17 while the electric connection surface 7 of the lower semiconductor element 3 is electrically connected to segments 25 of the wiring on the wiring board 19 by means of bumps 23.

With this configuration, a mounting density of the semiconductor device becomes twice that of a conventional semiconductor device in which a mounting area is occupied with one semiconductor element. Accordingly, it is possible to miniaturize an electronic device using the semiconductor device.

The above-described related art semiconductor device, however, has a problem that since the back surfaces of the two semiconductor elements are fixed to each other, the upper semiconductor element has the electric connection surface on the upper side, and accordingly, any other semiconductor device is no longer stacked on the upper semiconductor element. That is to say, the related art semiconductor device cannot be configured to have a stacked structure of two or more layers. The related art semiconductor device has another problem that since the upper surface of the upper semiconductor element is taken as the electric connection surface and the bonding wires are connected to the electric connection surface, wire loops 17a (see FIG. 4) of the bonding wires project upwardly from the upper surface of the upper semiconductor element, so that the total height of the semiconductor device becomes correspondingly higher. This causes an obstacle to thinning the whole semiconductor device.

SUMMARY OF THE INVENTION

An object of the present invention is to provide a semiconductor device having a stacked structure of a plurality of semiconductor elements, which is capable of increasing a mounting density thereof and reducing a thickness thereof, thereby miniaturizing an electronic device using the semiconductor device, and to provide a structure of the semiconductor device.

To achieve the above object, according to a first aspect of the present invention, there is provided a semiconductor device bonded to a wiring board, including a semiconductor element; a bump for flip chip bonding formed on a surface of the semiconductor element; and a wiring pattern for connecting to a bump and a bonding wire of another semiconductor element, formed on the other surface of the semiconductor element.

With this configuration, since the wiring pattern to which the bump and the bonding wire for another semiconductor element are connected is formed on the other surface of the semiconductor element, another semiconductor element can be bonded to the other surface of the semiconductor element in a flip-chip bonding manner, and the bonding wires can be connected to the bumps of another semiconductor element via the wiring pattern. A semiconductor device of a type in which a back surface of a semiconductor element is used as a surface to which another semiconductor element is fixed has been known; however, in this semiconductor device, the back surface of the semiconductor element is used only as the means for fixing another semiconductor element. On the contrary, according to the present invention, the other surface, provided with the wiring pattern, of the semiconductor element can be used not only as the fixing means but also as a wiring surface similar to that of a usual wiring board. As a result, it is possible to realize high density mounting to a wiring board by making more effective use of the other surface of the semiconductor element.

According to a second aspect of the present invention, there is provided a semiconductor device structure including: a first semiconductor element bonded to a wiring board as a flip chip; a wiring pattern formed on a back surface of the first semiconductor element, and connected to a wire formed on the wiring board by means of a bonding wire; and a second semiconductor element bonded to the back surface of the first semiconductor element as a flip chip.

With this configuration, the first semiconductor element is bonded to the wiring board in a flip-chip bonding manner and the second semiconductor element is bonded to the back surface of the first semiconductor element in a flip-chip bonding manner, and the wiring pattern of the first semiconductor element is connected to the wiring board by means of the bonding wires. As a result, electrodes of the second semiconductor element can be led from the back surface of the first semiconductor element. According to the related art structure in which the back surface of the second semiconductor element is fixed to the back surface of the first semiconductor element, the bonding wires are connected to the front surface of the second semiconductor element (uppermost surface of the stacked structure), and thereby the bonding wires project from the uppermost surface of the stacked structure by an amount equivalent to a height of the wire loops, with a result that the total height of the semiconductor device becomes high. On the contrary, according to the present invention, since the bonding wires are led from the back surface of the first semiconductor element, the height of the wire loops is contained within a thickness of the second semiconductor element. As a result, the wire loops do not project from the uppermost surface of the stacked structure, to realize thinning of the semiconductor device including a plurality of semiconductor elements stacked to each other.

The above-described semiconductor device structure may further comprise a plurality of semiconductor elements having a wiring pattern formed on a back surface respectively, and multi-stacked on the back surface of the first semiconductor element as flip chips, wherein each the wiring pattern is connected to a wire formed on the wiring board by means of a bonding wire.

With this configuration, adjacent two of the semiconductor elements stacked in the vertical direction are bonded to each other in a flip-chip bonding manner, and the wiring pattern formed on the bask surface of each of the plurality of semiconductor elements is connected to segments of wiring formed on the wiring board by means of bonding wires. In the related art semiconductor device having the structure that the back surface of the second semiconductor element is fixed to the back surface of the first semiconductor element, the semiconductor device is of a stacked structure of two semiconductor elements. On the contrary, according to the present invention, two or more semiconductor elements can be stacked to each other, to realize a semiconductor device with a higher mounting density.

The above-described semiconductor device structure may be configured such that at least two of the wiring patterns, which are formed on the different semiconductor elements, are connected by means of a bonding wire.

With this configuration, since arbitrary segments of the wiring patterns formed on the back surfaces of different two of the semiconductor elements are connected to each other, those located on arbitrary layers of the semiconductor elements can be connected to each other. As a result, it is possible to increase the degree of freedom in design of wiring of a semiconductor device of a multi-layer structure, and hence to omit useless bonding wires and shorten the bonding wires and thereby simplify the wiring structure.

DETAILED DESCRIPTION OF THE PREFERRED EMBODIMENTS

Hereinafter, preferred embodiments of a semiconductor device and a semiconductor device structure according to the present invention will be described in detail with reference to the drawings.

Figure 1:
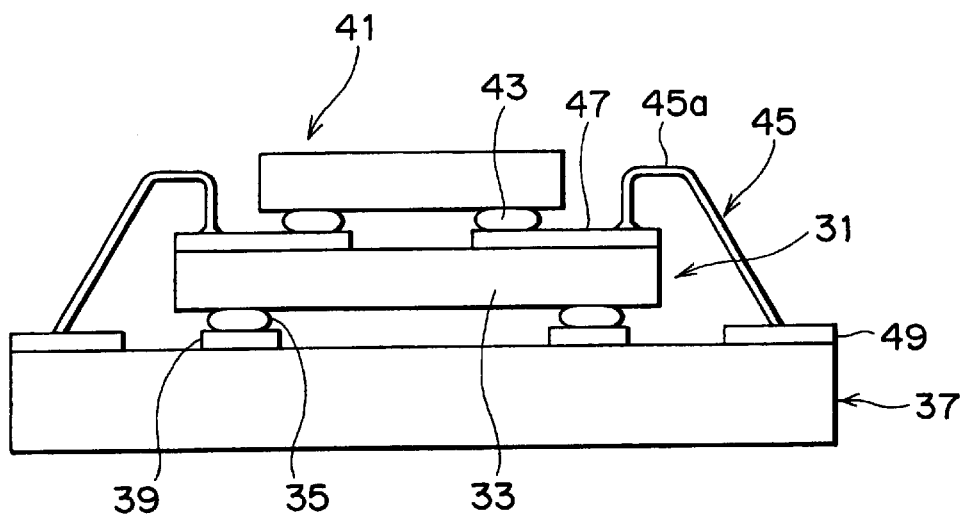
FIG. 1 is a side view of a semiconductor device structure using a semiconductor device according to the present invention.
Figure 2:
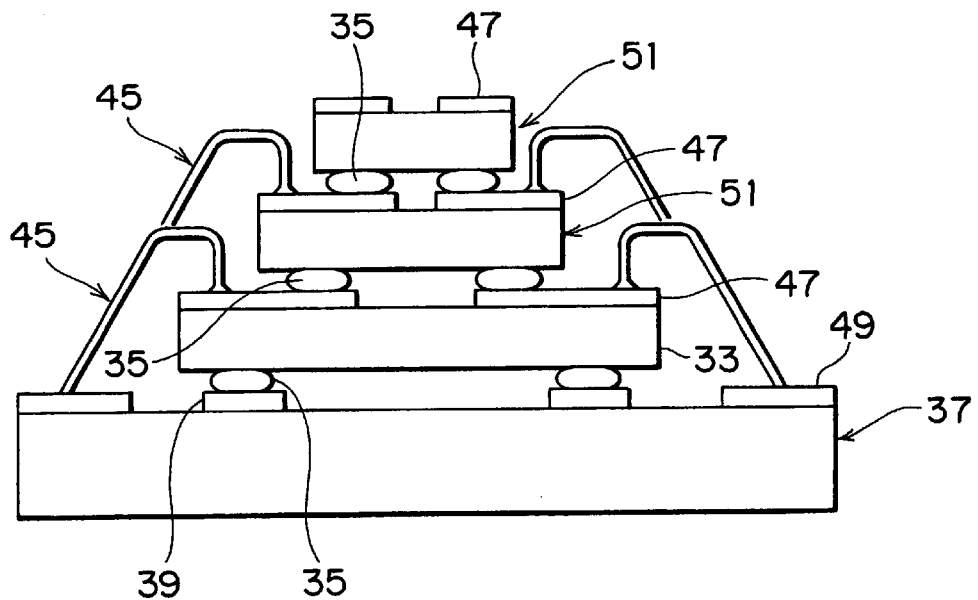
FIG. 2 is a side view of a modification of the semiconductor device structure according to the present invention.
Figure 3:
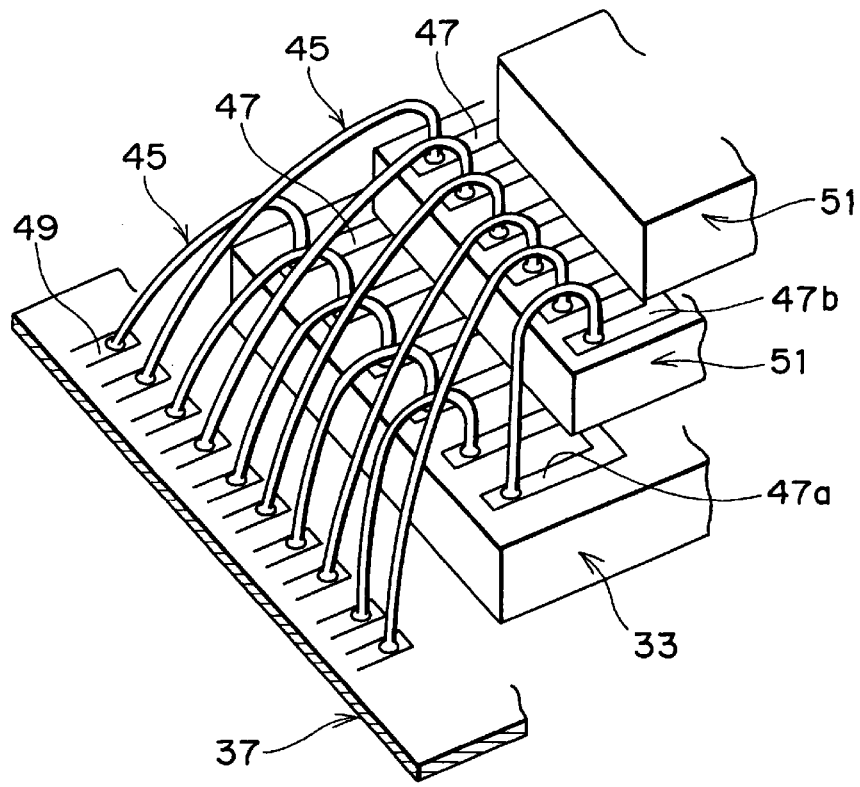
FIG. 3 is an enlarged sectional view showing an essential portion shown in FIG. 2.
Figure 4:
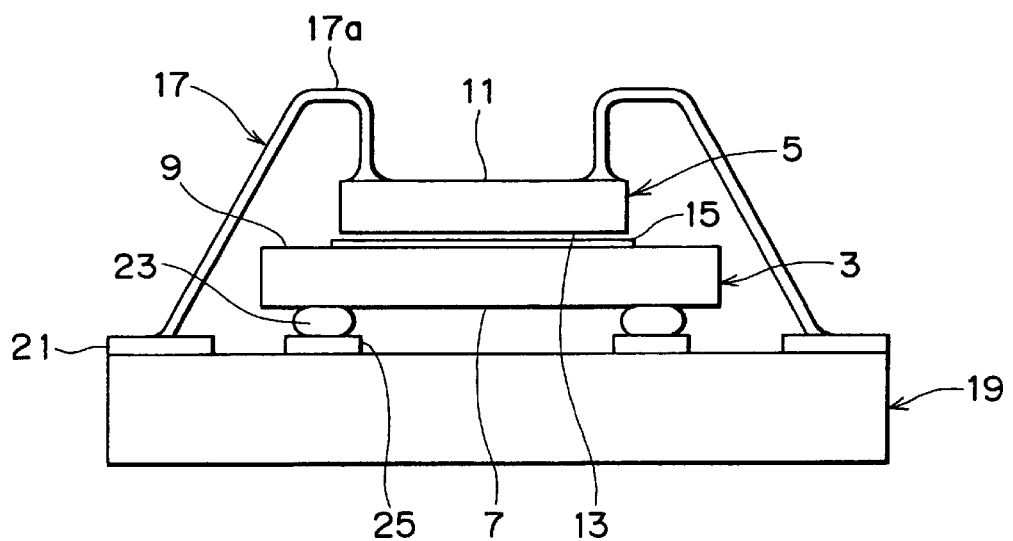
FIG. 4 is a side view of a related art semiconductor device structure.

FIG. 1 is a side view of a semiconductor device structure using a semiconductor device according to the present invention; FIG. 2 is a side view of a modification of the semiconductor device structure according to the present invention; and FIG. 3 is an enlarged perspective view of an essential portion shown in FIG. 2.

In a semiconductor device 31 according to this embodiment, bumps 35 for flip-chip bonding are formed on a front surface (bottom surface in FIG. 1) of a semiconductor element 33. The bumps 35 are opposed to segments of wiring 39 on a wiring board 37 and bonded thereto by hot-pressing, whereby the semiconductor element 33 is electrically connected to the wiring board 37 in a so-called flip-chip bonding manner.

A wiring pattern 47, to which bumps 43 and bonding wires 45 for another semiconductor element 41 are to be connected, is formed on a back surface (top surface in FIG. 1) of the semiconductor element 33. The wiring pattern 47 is arbitrarily formed, for example, in accordance with a specification of another semiconductor element 41. Specifically, the wiring pattern 47 has at least a bump connecting portion to which the bumps 43 are to be connected and a pad portion to which the bonding wires 45 are to be connected. Since a side portion of another semiconductor element 41 is offset inwardly from a side portion of the semiconductor element 33, the pad portion to which the bonding wires 45 are to be connected is exposed. Accordingly, the bonding wires 45 can be easily connected, from above, to the exposed pad portion of the wiring pattern 47.

According to the semiconductor device 31, since the wiring pattern 47 is formed on the back surface of the semiconductor element 33, another semiconductor element 41 can be bonded to the back surface of the semiconductor element 33 in a flip-chip bonding manner. The bonding wires 45 can be connected, via the wiring pattern 47, to the bumps 43 of another semiconductor element 41 bonded to the semiconductor element 33 in a flip-chip bonding manner. In the related art semiconductor device in which the back surface of the semiconductor element is used only as a surface to which another semiconductor element is fixed, the back surface of the semiconductor element is used only as the means for fixing another semiconductor element. On the contrary, according to the semiconductor device 31 in this embodiment, the back surface, provided with the wiring pattern, of the semiconductor element 33 can be used not only as the fixing means but also as a wiring surface similar to that of a usual wiring board. As a result, it is possible to realize high density mounting to the wiring board 37 by making more effective use of the back surface of the semiconductor element 33.

A semiconductor device structure using the semiconductor device 31 configured as described above will be described below. It is to be noted that for convenience of description, the lower side semiconductor element 33 is referred to as "first semiconductor element" and the upper side semiconductor element 41 is referred to as "second semiconductor element".

In this semiconductor device structure, the first semiconductor element 33 is bonded, in a flip-chip bonding manner, to the wiring board 37, and the second semiconductor element 41 is bonded, in a flip-chip bonding manner, to the wiring pattern 47 formed on the back surface of the first semiconductor element 33. The wiring pattern 47 formed on the back surface of the first semiconductor element 33 is electrically connected to segments of wiring 49 on the wiring board 37 by means of bonding wires 45.

According to the semiconductor device structure, the first semiconductor element 33 is bonded, in a flip-chip bonding manner, to the wiring board 37 and the second semiconductor element 41 is further bonded, in a flip-chip bonding manner, to the back surface of the first semiconductor element 33, and further the wiring pattern 47 of the first semiconductor element 33 is connected to segments of the wiring 49 of the wiring board 37 by means of the bonding wires 45. The electrodes (bumps 43) of the second semiconductor element 41 can be led from the back surface of the first semiconductor element 33.

In the related art structure in which the back surface of the second semiconductor element 41 is fixed to the back surface of the first semiconductor element 33, the bonding wires 45 are connected to the front surface of the second semiconductor element 41 (uppermost surface of the stacked structure), so that the bonding wires 45 projects upwardly from the uppermost surface of the stacked structure by an amount equivalent to the height of the wire loops and thereby the total height of the semiconductor device becomes high. On the contrary, according to the semiconductor device structure in this embodiment, since the bonding wires 45 are led from the back surface of the first semiconductor element 33, the height of the wire loops 45a is contained within the thickness (mounting height) of the second semiconductor element 41. Accordingly, the semiconductor device structure in this embodiment, in which a plurality (two layers in this embodiment) of the semiconductor elements are stacked to each other, can be thinned by an amount equivalent to the height of the wire loops 45a as compared with the related art structure.

According to the semiconductor device structure in this embodiment, since the wiring pattern 47 serves as the so-called interposer, the specification of the second semiconductor element 41 can be freely changed by changing the design of the wiring pattern 47. This makes it possible to flexibly, readily meet user's needs. For example, enlargement of a memory capacity, free exchange of kinds of memories, a combination with another semiconductor element, and the like can be freely performed within a limited mounting area.

The semiconductor device described in the embodiment has the stacked structure of two semiconductor elements; however, according to the present invention, a semiconductor device with a higher mounting density can be obtained by stacking a plurality of semiconductor elements to each other. In a modification shown in FIG. 2, two or more semiconductor elements 51, on a back surface of each of which a wiring pattern 47 is formed, are stacked on the back surface of the first semiconductor element 33 in such a manner that adjacent two of the semiconductor elements 33 and 51 stacked in the vertical direction are bonded to each other in a flip-chip bonding manner. As a result, it is possible to realize a semiconductor device structure including a plurality (for example, three or four) of semiconductor elements stacked to each other in multi-stages. In this case, as shown in FIG. 3, the wiring pattern 47 formed on the back surface of each of the semiconductor elements 33 and 51 is connected to segments of the wiring 39 formed on the wiring board 37.

With this configuration, a stacked structure of three or more layers can be obtained by repeatedly stacking a plurality of the semiconductor elements 33 and 51 in multi-stages in such a manner that adjacent two of the semiconductor elements 33 and 51 stacked in the vertical direction are bonded to each other in a flip-chip bonding manner. In the related art structure that the back surface of the second semiconductor element is fixed to the back surface of the first semiconductor element, only a stack structure of two layers can be obtained. On the contrary, according to this embodiment, a stacked structure of three or more layers can be obtained, and therefore, a semiconductor device with a higher mounting density can be obtained. Additionally, for such a multi-layer structure, the wiring pattern 47 on the uppermost semiconductor element can be omitted.

For such a multi-layer structure, an arbitrary segment 47a of the wiring pattern 47 formed on the back surface of the semiconductor element 33 may be connected to an arbitrary segment 47b of the wiring pattern 47 formed on the back surface of the semiconductor element 51 by means of the bonding wire 45. With this configuration, the semiconductor elements on arbitrary layers can be connected to each other. As a result, it is possible to increase the degree of freedom in design of wiring of a semiconductor device having a multi-layer structure, and hence to omit useless bonding wires 45 and shorten the bonding wires 45 and thereby simplify the wiring structure.

While the preferred embodiments of the present invention have been described using specific terms, such description is for illustrative purposes only, and it is to be understood that changes and variations may be made without departing from the spirit or scope of the following claims.

What is claimed is:

1. A semiconductor device bonded to a wiring board, comprising:
    a semiconductor element;
    a bump for flip chip bonding formed on a first surface of said semiconductor element;
    a wiring pattern for connecting to a bump of another semiconductor element, formed on a second surface of said semiconductor element opposite the first surface; and
    a bonding wire connected between said wiring pattern and said wiring board.

2. A semiconductor device structure comprising:
    a first semiconductor element having a front surface bonded to a wiring board as a flip chip;
    a wiring pattern formed on a back surface of said first semiconductor element opposite the front surface, and connected to a wire formed on said wiring board by means of a bonding wire; and
    a second semiconductor element bonded to said wiring pattern as a flip chip.

3. A semiconductor device structure according to claim 2, further comprising:
    a plurality of semiconductor elements having a wiring pattern formed on a back surface respectively, and multi-stacked on said back surface of said first semiconductor element as flip chips,
    wherein each said wiring pattern is connected to a wire formed on said wiring board by means of a bonding wire.

4. A semiconductor device structure according to claim 3, wherein at least two of said wiring pattern, which are formed on the different semiconductor elements, are connected by means of a bonding wire.

* * * * *